(12) United States Patent
Im et al.

(10) Patent No.: US 10,619,095 B2
(45) Date of Patent: Apr. 14, 2020

(54) NASICON-STRUCTURED PHOSPHOR AND LIGHT EMITTING ELEMENT COMPRISING SAME LUMINESENT MATERIALS

(71) Applicant: INDUSTRY FOUNDATION OF CHONNAM NATIONAL UNIVERSITY, Gwangju (KR)

(72) Inventors: Won Bin Im, Gwangju (KR); Yoon Hwa Kim, Jeollanam-do (KR)

(73) Assignee: INDUSTRY FOUNDATION OF CHONNAM NATIONAL UNIVERSITY, Gwangju (KR)

(*) Notice: Subject to any disclaimer, the term of this patent is extended or adjusted under 35 U.S.C. 154(b) by 183 days.

(21) Appl. No.: 15/329,434

(22) PCT Filed: Apr. 28, 2015

(86) PCT No.: PCT/KR2015/004247
§ 371 (c)(1),
(2) Date: Jan. 26, 2017

(87) PCT Pub. No.: WO2016/017904
PCT Pub. Date: Feb. 4, 2016

(65) Prior Publication Data
US 2017/0210984 A1    Jul. 27, 2017

(30) Foreign Application Priority Data
Jul. 28, 2014  (KR) .................. 10-2014-0095873

(51) Int. Cl.
*C09K 11/77* (2006.01)
*C09K 11/02* (2006.01)
*H01L 33/50* (2010.01)

(52) U.S. Cl.
CPC .......... *C09K 11/7795* (2013.01); *C09K 11/02* (2013.01); *C09K 11/7777* (2013.01); *H01L 33/502* (2013.01)

(58) Field of Classification Search
CPC ............ C09K 11/7795; C09K 11/7709; C09K 11/7737; C09K 11/7752; C09K 11/7777
See application file for complete search history.

(56) References Cited

U.S. PATENT DOCUMENTS

2005/0253500 A1* 11/2005 Gotoh ................ C09K 11/0838
313/486

FOREIGN PATENT DOCUMENTS

JP    2011-206766 A    10/2011
JP    2013-177523 A    9/2013

OTHER PUBLICATIONS

Machine translation of JP2013177523. accessed on https://patents.google.com/patent/JP2013177523A/en?oq=JP2013-177523. (Year: 2013).*

(Continued)

*Primary Examiner* — Matthew E. Hoban
(74) *Attorney, Agent, or Firm* — The PL Law Group, PLLC

(57) ABSTRACT

A phosphor of a chemically stable inorganic luminescent material having a NASICON structure and an application product including the phosphor, such as a light-emitting device. A phosphor having the formula of $A_{1+x}B_xC_{2-x}D_3X_{12}:AE_y$, where A is one or two types of elements of monovalent metal cations, B is one or two types of elements of trivalent cations, C is one or two types of elements of tetravalent cations, D is one or two types of elements of pentavalent cations, X is one or two types of elements of N, O, F, P, S, O, Cl, and Br, AE is one or two types of elements of Mn, Ce, Nd, Sm, Eu, Tb, Dy, Ho, Er, Tm, Yb, Th, U, and Bi, $0 \leq x \leq 2$, and $0 \leq y \leq 0.1$.

24 Claims, 13 Drawing Sheets

(56) References Cited

OTHER PUBLICATIONS

International Search Report for PCT/KR2015/004247.
Collin, G. et. al., Disorder of Tetrahedra in Nasicon-Type Structure-I, Journal of Phys. Chem. Solids vol. 47, No. 9, pp. 843-854, 1986. See abstract.
Boilot, J. P. et. al., Phase Transition in NASICON Compounds ($Na_3Sc_2P_3O_{12}$ and $Na1+x Zt2 (P3-X Six)O12$, Solid State Ionics 5 (1981) p. 307-310. See abstract and fig. 1.
Wickleder, M. S., Inorganic Lanthanide Compounds with Complex Anions, Chem. Rev. 2002, 102, 2011-2087. See tabel 4, p. 2027.
Office action dated Apr. 3, 2018 from Japan Intellectual Property Office in a counterpart Japanese Patent Application No. 2017-504420 (all the cited references are listed in this IDS.) (English translation is also submitted herewith.).

* cited by examiner

NASICON-STRUCTURED PHOSPHOR AND LIGHT EMITTING ELEMENT COMPRISING SAME LUMINESENT MATERIALS

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2015/004247, filed Apr. 28, 2015, which claims priority to the benefit of Korean Patent Application No. KR 10-2014-0095873 filed in the Korean Intellectual Property Office on Jul. 28, 2014, the entire contents of which are incorporated herein by reference.

TECHNICAL FIELD

The present invention relates, in general, to a phosphor and, more particularly, to a chemically stable inorganic luminescent materials having a sodium (Na) Super Ionic CONductor (NASICON) structure and an application product including the phosphor, such as light-emitting device.

BACKGROUND ART

Globally known phosphor receive energy from an excitation source having high energy, such as vacuum ultraviolet rays, ultraviolet rays, electron beams, near-ultraviolet rays, and blue rays, and emit visible rays in vacuum fluorescent displays (VFD), field emission displays (FED), plasma display panels (PDP), cathode ray tubes (CRT), and white light-emitting diodes (WLED). Among the above-mentioned applications, particularly, research on light-emitting diodes (LEDs), having advantages of high efficiency and environmental friendliness compared to conventional methods, has been actively carried out in accordance with the growing worldwide interest in environmental problems such as the recent global energy crisis and global warming.

In order to use an LED, which has clear advantages as a solid light source to replace a conventional light source, it is most important to realize high-quality white light, and accordingly, a phosphor having desirable properties is required. Methods for realizing white light using LEDs are broadly classified into three groups. The first method is to obtain a white LED by combining three LEDs respectively exhibiting red, green, and blue colors. In this method, since the emission wavelength spectrum is wide, color rendering is excellent. However, there are drawbacks that the operating voltage is uneven for each chip and the output of the chip depends on the ambient temperature, thus causing variability of color coordinates, and that the price is high. A second method is to obtain a white color by exciting a yellow fluorescent substance using a blue LED as a light source. In this method, since a simple structure including one chip and two terminals is used, manufacturing costs may be reduced and light emission efficiency is excellent. However, since the color rendering index is low due to poor emission of light in a red region, it is difficult to apply the second method to a high-quality solid light source. A third method is to obtain a white color by mixing blue, green, yellow, and red fluorescent substances using a near-UV LED as a light source. This method is very similar to the method of forming a fluorescent lamp using ultraviolet rays. In this method, a very wide wavelength spectrum is ensured, as in the case of an incandescent lamp, color stability is excellent, and it is easy to control the correlated color temperature and color rendering index. Accordingly, this method is currently being studied for the implementation of white LEDs for illumination.

The second method is the most popular method, but it is difficult to develop and utilize technology related to this method due to a patent held by Nichia Corporation in Japan. Therefore, there is a need to develop a high-efficiency phosphor to be combined with a near-UV LED. In particular, in the near-UV LED, a blue phosphor functions as an excitation source of a phosphor having a long wavelength (a green color to a red color), and thus the characteristics of the blue phosphor are important. Blue phosphor developed to date have good light emission efficiency but poor thermal stability at high temperatures during operation of the near-UV LED. Accordingly, it is difficult to apply such blue phosphor. Therefore, it is necessary to develop a blue phosphor having a novel composition, favorable light emission efficiency and thermal stability, without infringing on the patent of another phosphor.

Meanwhile, a $Na_3Sc_2P_3O_{12}$ crystal phase, which is one of NASICON structures, is a phosphate that is formed using a calcining process of $NaHCO_3$—$Sc_2O_3$—$(NH_4)_2HPO_4$ raw material for use as an ionic conductor. The formation of the $Na_3Sc_2P_3O_{12}$ crystal phase was confirmed by G. Collin et al. The formation process and mechanism of the $Na_3Sc_2P_3O_{12}$ crystal phase have been reported in detail in academic documents published prior to this application [1] M. de la Rochère et al., Solid State Ionics 9-10 (1983) 825-828. 2) G. Collin et al., Journal of Physics and Chemistry of Solids 47(9) (1986) 843-854]. The content of the report described in the above documents refers only to ionic conductivity, and no research has been performed so far on the use of this structure as a phosphor.

SUMMARY

The present inventors have conducted extensive research and found that an optically active element can be substituted in a crystal phase of $Na_3Sc_2P_3O_{12}$ structure, that can be used as a phosphor, thereby accomplishing the present invention.

Accordingly, the present invention has been made keeping in mind the above problems occurring in the related art, and an object of the present invention is to provide an inorganic luminescent materials that has excellent thermal stability at high temperatures, a novel composition, and a NASICON structure, and its application including the inorganic luminescent materials.

Another object of the present invention is to provide a useful inorganic luminescent materials having a NASICON structure, which is not reduced in terms of luminous intensity during exposure to an excitation source, thus being appropriately used in VFDs, FEDs, PDPs, CRTs, or WLEDs, and an application product including the inorganic luminescent materials.

A further object of the present invention is to provide a blue phosphor having a novel composition and high light emission efficiency and thermal stability compared to a conventional blue phosphor, and an application product including the blue phosphor, that is, a lighting apparatus having a high color rendering index and an image display unit having excellent durability.

Yet another object of the present invention is to provide an inorganic luminescent materials having a NASICON structure, which has various colors, for example, a blue color, or absorbs ultraviolet rays, thus being suitably used as a blue pigment or an ultraviolet-ray absorbent, and an application product including the inorganic luminescent materials.

It is to be understood that the object of the present invention is not limited to the above-mentioned objects, but may include other objects that can be recognized by a person skilled in the art from the detailed description of the invention, which will be given later, even if not explicitly mentioned.

In order to accomplish the above objects, the present invention provides a phosphor substance having the following Chemical Formula 1.

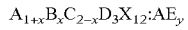  [Chemical Formula 1]

In Chemical Formula 1, A is one type or two types of elements selected from a group consisting of monovalent metal cations, B is one type or two types of elements selected from a group consisting of trivalent cations, C is one type or two types of elements selected from a group consisting of tetravalent cations, D is one type or two types of elements selected from a group consisting of pentavalent cations, X is one type or two types of elements selected from a group consisting of N, O, F, P, S, O, Cl, and Br, AE is one type or two types of elements selected from a group consisting of Mn, Ce, Nd, Sm, Eu, Tb, Dy, Ho, Er, Tm, Yb, Th, U, and Bi, $0 \leq x \leq 2$, and $0 \leq y \leq 0.1$.

In a preferable embodiment, the phosphor is an inorganic compound having the same crystal structure as the crystal phase of $Na_3Sc_2P_3O_{12}$ or a $Na_3Sc_2P_3O_{12}$ solid solution.

In the preferable embodiment, A is any one among Li, Na, K, Rb, and Cs, B is any one among Sc, Cr, Fe, Y, La, Gd, and Lu, C is any one among C, Si, Ti, Ge, and Zr, and D is any one among N, P, and V.

In the preferable embodiment, the phosphor changes its crystal structure and is imparted with improved photoluminescence by heating.

In the preferable embodiment, the phosphor has the same crystal structure as an $\alpha$-$Na_3Sc_2P_3O_{12}$ crystal phase or a solid solution of the $\alpha$-$Na_3Sc_2P_3O_{12}$ crystal phase at room temperature, has the same crystal structure as a $\beta$-$Na_3Sc_2P_3O_{12}$ crystal phase or a solid solution of the $\beta$-$Na_3Sc_2P_3O_{12}$ crystal phase when the phosphor is heated to 50 to 60° C., and has the same crystal structure as a $\gamma$-$Na_3Sc_2P_3O_{12}$ crystal phase or a solid solution of the $\gamma$-$Na_3Sc_2P_3O_{12}$ crystal phase when the phosphor is heated to 150° C. or higher.

In the preferable embodiment, the phosphor has the following Chemical Formula 2-1 or 2-2.

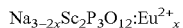  [Chemical Formula 2-1]

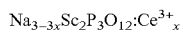  [Chemical Formula 2-2]

where $0 < x \leq 0.5$.

In the preferable embodiment, when ultraviolet or visible light in a wavelength range of 100-450 nm, or electron beam are radiated as an excitation source, the phosphor exhibits emission of near-ultraviolet rays or blue rays having a wavelength in a range of 350 to 500 nm.

In the preferable embodiment, the phosphor emits color in the visible region during radiation of an excitation source, thereon to satisfy the condition of $0.01 \leq x \leq 0.3$ with respect to (x, y) values of CIE chromaticity coordinates.

In order to accomplish the above objects, the present invention also provides a phosphor composition including the phosphor and a crystal phase or non-crystal phase compound different from the phosphor.

In the preferable embodiment, the phosphor is a powder having an average particle size in the range of 0.1 to 20 µm.

In the preferable embodiment, the crystal phase or non-crystal phase compound is a conductive inorganic material, and is an oxide, an oxynitride, or a nitride including one type element or two types or more elements selected from among Zn, Al, Ga, In, and Sn.

In the preferable embodiment, the crystal phase or non-crystal phase compound is an inorganic luminescent material having emission which is different from that of the phosphor.

In order to accomplish the above objects, the present invention also provides a light-emitting device including an excitation light source of 300 to 550 nm and one or more of the phosphor.

In order to accomplish the above objects, the present invention also provides an image display unit including one or more of the phosphor In order to accomplish the above objects, the present invention also provides a pigment including one or more of the phosphor.

In order to accomplish the above objects, the present invention also provides an ultraviolet-ray absorbent including one or more of the phosphor.

The present invention has the following effects.

First, the present invention provides an inorganic luminescent material that has excellent thermal stability at high temperatures, a novel composition, and a NASICON structure, and an application product including the inorganic luminescent material.

Further, the present invention provides a useful inorganic luminescent material having a NASICON structure, which is not reduced in terms of emission intensity during exposure to an excitation source, thus being appropriately used in VFDs, FEDs, PDPs, CRTs, or WLEDs, and an application product including the inorganic luminescent material.

Further, the present invention provides a blue phosphor having a novel composition and high emission efficiency and thermal stability compared to a conventional blue phosphor, and an application product including the blue phosphor, that is, a lighting apparatus having a high color rendering index and an image display unit having excellent durability.

Further, the present invention provides an inorganic fluorescent substance having a NASICON structure, which has various colors, for example, a blue color, or absorbs ultraviolet rays, thus being suitably used as a blue pigment or an ultraviolet-ray absorbent, and an application product including the inorganic luminescent material.

It is to be understood that the technical effects of the present invention are not limited to the above-mentioned range, but may include other effects of the invention that can be recognized by a person skilled in the art from the detailed description for carrying out the invention, which will be given later, even if not explicitly mentioned.

DETAILED DESCRIPTION

Figure 1:
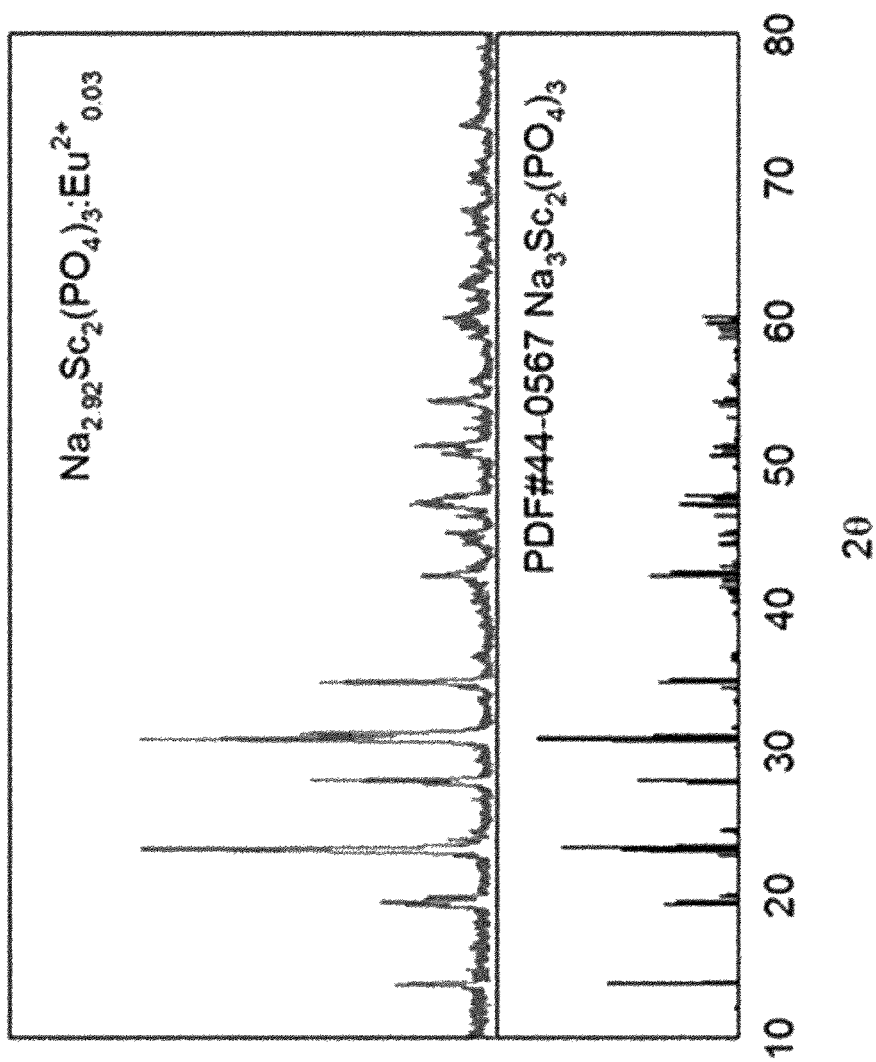
FIG. 1 shows an X-ray diffraction pattern of a phosphor (Example 1) according to an Example of the present invention.
Figure 2:
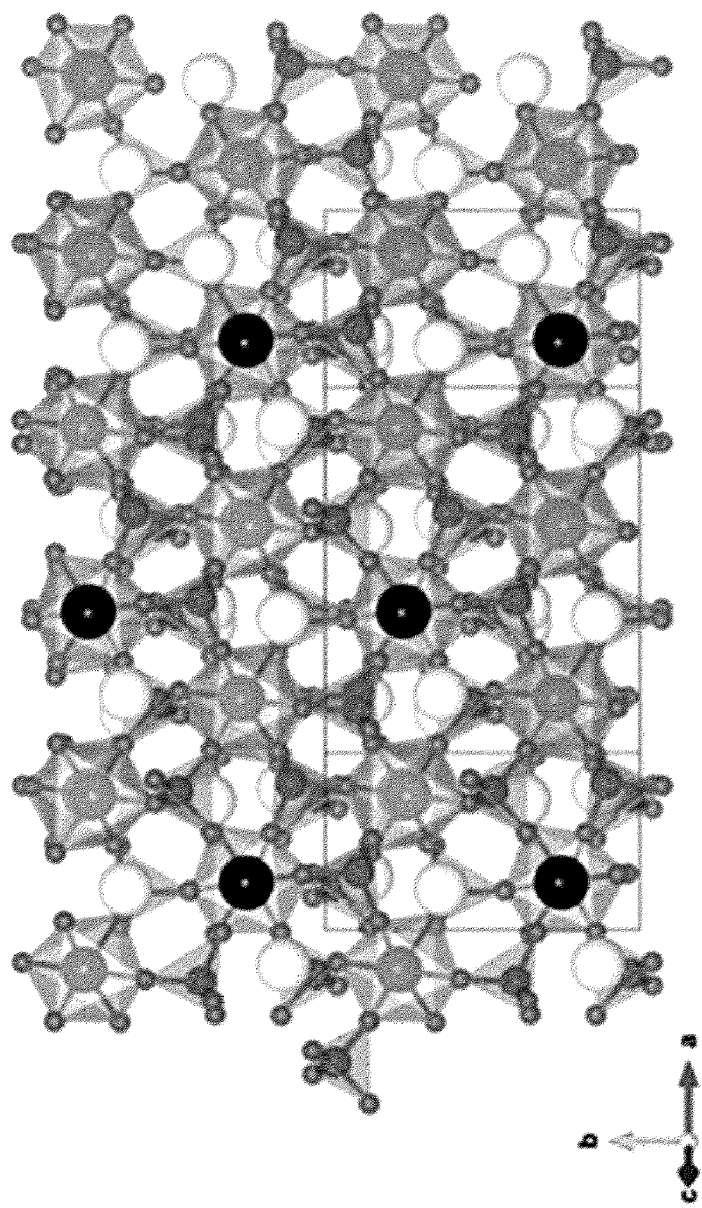
FIG. 2 shows a crystal structure model of $\alpha$-$Na_3Sc_2P_3O_{12}$ to the phosphor of the X-ray diffraction pattern of FIG. 1.

While the present invention has been described using terms relating to what is presently considered to be the most practical and preferred embodiment, it is to be understood that these may vary depending on the intention of a person skilled in the art, precedents, and the emergence of new technology. Further, in certain cases, there may be a term arbitrarily selected by the applicant, in which case the meaning thereof will be described in detail in the description of the relevant invention. Accordingly, the terms used in the present invention should not be construed as merely descriptive terms, but should be interpreted based on the ordinary meanings of the terms and the contents described throughout the specification of the present invention.

Hereinafter, the technical structure of the present invention will be described in detail with reference to the accompanying drawings and preferred embodiments.

However, the present invention is not limited to the embodiments described herein but may be embodied in other forms. Like reference numerals used to describe the present invention throughout the specification denote like elements.

The technical characteristics of the present invention include an inorganic fluorescent substance having the same crystal structure as a $Na_3Sc_2P_3O_{12}$ crystal phase, which is any one of a NASICONs [sodium (Na) super ionic conductor], or a solid solution of the $Na_3Sc_2P_3O_{12}$ crystal phase. The inorganic luminescent material has high emission efficiency, excellent thermal stability, and a novel composition.

That is, the present inventors have conducted a detailed study on a phosphor using a multi-membered inorganic crystal phase, including monovalent cations such as Na, trivalent cations such as Sc, tetravalent cations such as Zr, and pentavalent cations such as P, as a mother matrix. Thereby, it was found that when an optically active element is solid-solved in a phosphor having a specific composition or a specific crystal structure as a mother matrix, in particular, in the crystal structure of the $Na_3Sc_2P_3O_{12}$ crystal phase, to thus form a solid solution, an inorganic luminescent material having high emission efficiency and thermal stability, compared to a conventional phosphor, and a novel composition can be manufactured.

Therefore, the present invention provides a fluorescent substance having the following Chemical Formula 1.

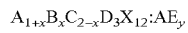  [Chemical Formula 1]

$A_{1+x}B_xC_{2-x}D_3X_{12}:AE_y$      [Chemical Formula 1]

In Chemical Formula 1, A is one type or two types of elements selected from the group consisting of monovalent metal cations, B is one type or two types of elements selected from the group consisting of trivalent cations, C is one type or two types of elements selected from the group consisting of tetravalent cations, D is one type or two types of elements selected from the group consisting of pentavalent cations, X is one type or two types of elements selected from the group consisting of N, O, F, P, S, O, Cl, and Br, AE is one type or two types of elements selected from the group consisting of Mn, Ce, Nd, Sm, Eu, Tb, Dy, Ho, Er, Tm, Yb, Th, U, and Bi, $0 \leq x \leq 2$, and $0 \leq y \leq 0.1$.

A, which is a monovalent metal cation, may be any one among Li, Na, K, Rb, and Cs, B, which is a trivalent cation, may be any one among Sc, Cr, Fe, Y, La, Gd, and Lu, C, which is a tetravalent cation, may be any one among C, Si, Ti, Ge, and Zr, and D, which is a pentavalent cation, may be any one among N, P, and V.

Examples of the phosphor may include a phosphor in which A is Na, B is Sc, X is O, and AE is Eu, a phosphor in which A is Na, B is Sc, C is Zr, X is O, and AE is Ce, a phosphor in which A is Na, B is Sc, D is P, X is O, and AE is Eu, and a phosphor in which A is Na, B is Sc, C is Zr or a mixture of Zr and Si, D is P, X is O, and AE is Ce.

Further, the phosphor of the present invention is changed in crystal structure and is imparted with improved photoluminescence by heating.

For example, in the case where the crystal structure of the phosphor is the same as that of an $\alpha$-$Na_3Sc_2P_3O_{12}$ crystal phase or a solid solution of the $\alpha$-$Na_3Sc_2P_3O_{12}$ crystal phase at room temperature, the crystal structure of the phosphor may be changed so as to be the same as that of a $\beta$-$Na_3Sc_2P_3O_{12}$ crystal phase or a solid solution of the $\beta$-$Na_3Sc_2P_3O_{12}$ crystal phase when the phosphor is heated to 50 to 60° C., and may also be changed so as to be the same as that of a $\gamma$-$Na_3Sc_2P_3O_{12}$ crystal phase or a solid solution of the $\gamma$-$Na_3Sc_2P_3O_{12}$ crystal phase when the phosphor is heated to 150° C. or higher.

The crystal structure is changed by heating, which enables the emission to be changed. For example, in the case where the phosphor has the same crystal structure as the $\alpha$-$Na_3Sc_2P_3O_{12}$ crystal phase and Eu is solid-solved in the crystal phase, emission light having a wavelength of 400 to 500 nm may be emitted during exposure to light having a wavelength of 100 to 450 nm. However, in the case where the phosphor has the same crystal structure as the $\gamma$-$Na_3Sc_2P_3O_{12}$ crystal phase and Ce is solid-solved in the crystal phase, emission light having a wavelength of 350 to 450 nm may be emitted during exposure to light having a wavelength of 100 to 400 nm.

Further, the phosphor of the present invention may be represented by the following Chemical Formula 2-1 or 2-2.

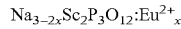       [Chemical Formula 2-1]

$Na_{3-2x}Sc_2P_3O_{12}:Eu^{2+}_x$      [Chemical Formula 2-1]

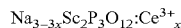       [Chemical Formula 2-2]

$Na_{3-3x}Sc_2P_3O_{12}:Ce^{3+}_x$      [Chemical Formula 2-2]

where $0 < x \leq 0.5$.

Particularly, when ultraviolet rays, visible rays, or electron rays having a wavelength in the range of 100 to 450 nm are radiated as an excitation source on the phosphor having Chemical Formula 2, the phosphor exhibits emission of near-ultraviolet rays or blue rays having a wavelength in the range of 350 to 500 nm. The phosphor having Chemical Formula 2 emits color in the visible region during radiation of an excitation source, thereon to satisfy the condition of $0.01 \leq x \leq 0.3$ with respect to (x, y) values of CIE chromaticity coordinates. Since the phosphor can emit near-ultraviolet rays having a wavelength of 400 nm or more or blue rays having a wavelength of 450 nm or more, it is possible to manufacture a white light-emitting diode having high emission efficiency and an excellent color rendering index using the above-mentioned light emission characteristics of the fluorescent substance.

The mixture of the metal compounds is calcined to obtain the phosphor of the present invention. For example, the raw material mixture, including raw materials that include Na, Sc, P, O, and AE (where AE is one type or two types of elements selected from the group consisting of Mn, Ce, Nd, Sm, Eu, Tb, Tb, Dy, Ho, Er, Tm, Yb, Th, U, and Bi) and which are mixed at the molar ratio shown in Chemical Formula 1 or 2, may be calcined in a reduction atmosphere at a temperature in the range of 1000 to 1600° C. under normal pressure, and then pulverized to thus obtain the phosphor. The calcining temperature may depend on the type of raw material. For example, when raw materials including Na, Zr, Si, P, O, and AE (where AE is one type or two types of elements selected from the group consisting of Mn, Ce, Nd, Sm, Eu, Tb, Tb, Dy, Ho, Er, Tm, Yb, Th, U, and Bi) are used, the raw materials may be calcined in a reduction atmosphere at a temperature in the range of 1200 to 1800° C. under normal pressure. The raw materials may be one or more among oxides, carbonates, nitrides, fluorides, or chlorides including constitutional elements.

Next, the present invention provides a phosphor composition including the phosphor and a crystal phase or non-crystal phase compound different from the phosphor. The phosphor is a powder having an average particle size in the range of 0.1 to 20 μm. The powder includes single crystal particles or a single crystal aggregate, and the content of the phosphor in the phosphor composition may be 10 wt % or more based on the total weight of the composition. The crystal phase or non-crystal phase compound included in the phosphor composition may be a conductive inorganic material, and may be an oxide, an oxynitride, or a nitride including one type element or two types or more elements selected from among Zn, Al, Ga, In, and Sn. In some cases, the crystal phase or non-crystal phase compound may be an inorganic luminescent material having photoluminescence that is different from that of the phosphor.

Next, the present invention may provide a light-emitting device including an excitation light source of 300 to 550 nm and one or more of the phosphor or the phosphor composition. Further, the present invention may provide an image display unit, a pigment, and an ultraviolet-ray absorbent including one or more of the phosphor or the phosphor composition.

Example 1

Sodium phosphate ($Na_3PO_4$), scandium oxide ($Sc_2O_3$), ammonium phosphate ($NH_4H_2PO_4$), and europium oxide ($Eu_2O_3$) were used as raw materials. Quantification of 0.3562 g of sodium phosphate, 0.3078 g of scandium oxide, 0.5135 g of ammonium phosphate, and 0.0157 g of europium oxide was performed so that a molar composition ratio of Na:Sc:P:O:Eu was 2.92:2:3:0.04, and mixing and pulverization were then performed in a dry state for 30 min using an agate mortar and a pestle. The mixture was placed into an alumina crucible. The crucible containing the mixture was heated to 350° C. in a box furnace, maintained for 1 hour, and naturally cooled. After the powder was again pulverized, the mixture was disposed in a horizontal alumina tube, heated to 1300° C. at a rate of 300° C./hr in a 5% hydrogen reduction atmosphere, serving as a calcination atmosphere, maintained at 1300° C. for 3 hours, and naturally cooled. After calcination, the calcined body was pulverized to manufacture a $Na_{2.92}Sc_2P_3O_{12}:Eu^{2+}_{0.04}$ phosphor.

Example 2

Sodium mono-phosphate ($NaPO_3$), scandium oxide ($Sc_2O_3$), ammonium phosphate ($NH_4H_2PO_4$), and cerium oxide ($CeO_2$) were used as raw materials. Quantification of 0.6575 g of sodium mono-phosphate, 0.3088 g of scandium oxide, 0.0309 g of ammonium phosphate, and 0.0154 g of cerium oxide was performed so that the molar composition ratio of Na:Sc:P:O:Ce was 2.88:2:3:0.04, and mixing and pulverization were then performed in a dry state for 30 min using an agate mortar and pestle. The mixture was placed into an alumina crucible. The mixture powder was disposed in a horizontal alumina tube, heated to 1500° C. at a rate of 300° C./hr in a 5% hydrogen reduction atmosphere as a calcination atmosphere, maintained at 1500° C. for 3 hours, and naturally cooled. After calcination, the calcined body was pulverized to manufacture a $Na_{2.88}Sc_2P_3O_{12}:Ce^{3+}_{0.04}$ phosphor.

Experimental Example 1

1. Preparation of Standard Material

In order to obtain pure α-$Na_3Sc_2P_3O_{12}$ containing no AE element as a standard material, quantification of 0.3694 g of sodium phosphate, 0.3108 g of scandium oxide, and 0.5184 g of ammonium phosphate was performed, and mixing and pulverization were then performed in a dry state for 30 min using an agate mortar and pestle. The crucible containing the mixture was heated to 350° C. in a box furnace, maintained for 1 hour, and naturally cooled. After the powder was pulverized again, the mixture was placed in an alumina crucible. The mixture powder was disposed in a horizontal alumina tube, heated to 1300° C. at a rate of 300° C./hr, maintained at 1300° C. for 3 hours, and naturally cooled. After the cooling, the calcined body was pulverized to prepare an α-$Na_3Sc_2P_3O_{12}$ crystal phase which was the standard material.

2. X-Ray Diffraction Measurement

X-ray diffraction measurement of the prepared standard material powder and the $Na_{2.92}Sc_2P_3O_{12}:Eu^{2+}_{0.04}$ phosphor obtained in Example 1 was performed using the Kα line of Cu. The resulting chart is shown in FIG. 1. Both compounds showed the patterns of FIG. 1, and were judged to be an α-$Na_3Sc_2P_3O_{12}$ crystal phase. The spatial group, determined according to a conventional document report [Inger S ø TOFTE and De-Chun Fu, Solid state Ionics 26 (1988) 307-310], was C2/c (spatial group #15).

Experimental Example 2

1. Preparation of Standard Material

In order to obtain pure γ-$Na_3Sc_2P_3O_{12}$ containing no AE element as a standard material, quantification of 0.6892 g of sodium mono-phosphate and 0.3108 g of scandium oxide was performed, and mixing by dry grinding for 30 min using an agate mortar and pestle. The mixture was placed into an alumina crucible. The mixture powder was disposed in a horizontal alumina tube, heated to 1500° C. at a rate of 300° C./hr, maintained at 1500° C. for 3 hours, and naturally cooled. The calcined body was pulverized to manufacture a γ-$Na_3Sc_2P_3O_{12}$ crystal phase which was the standard material.

2. X-Ray Diffraction Measurement

Figure 3:
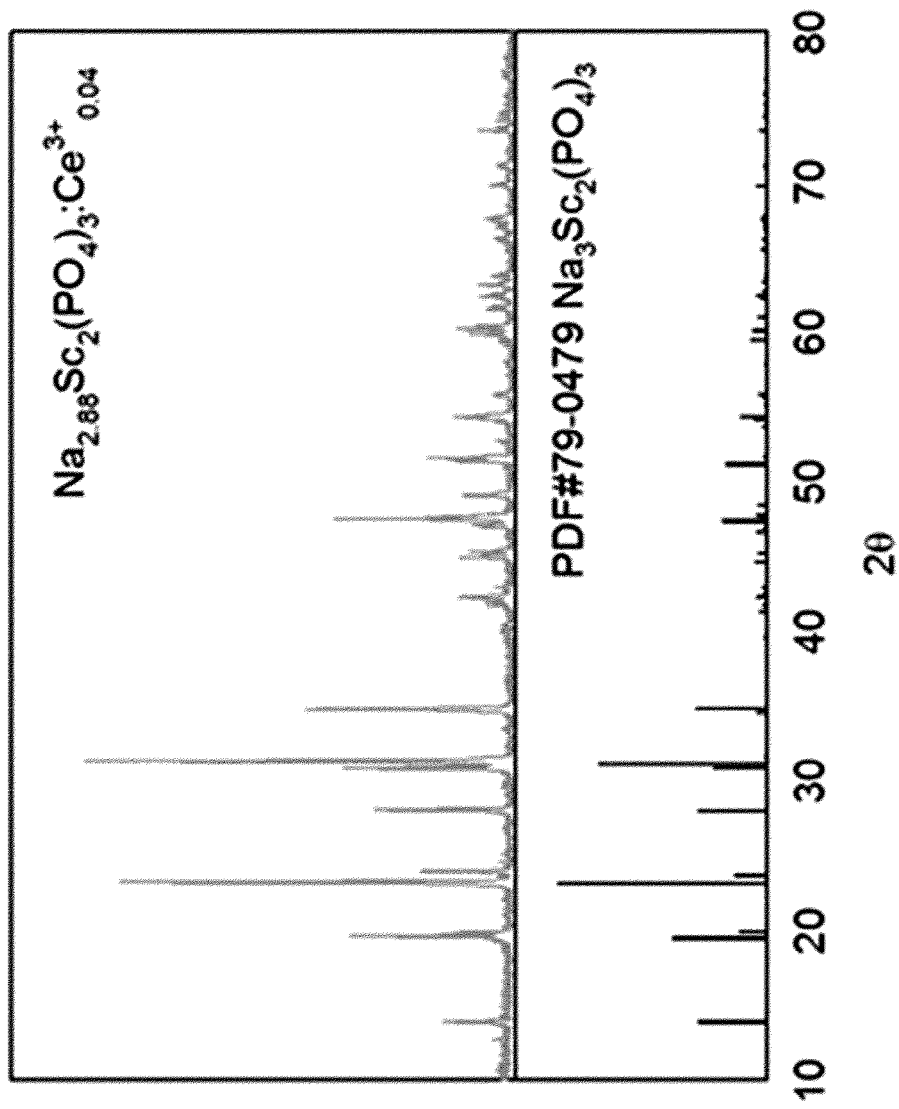
FIG. 3 shows an X-ray diffraction pattern of a phosphor (Example 2) according to another Example of the present invention.
Figure 4:
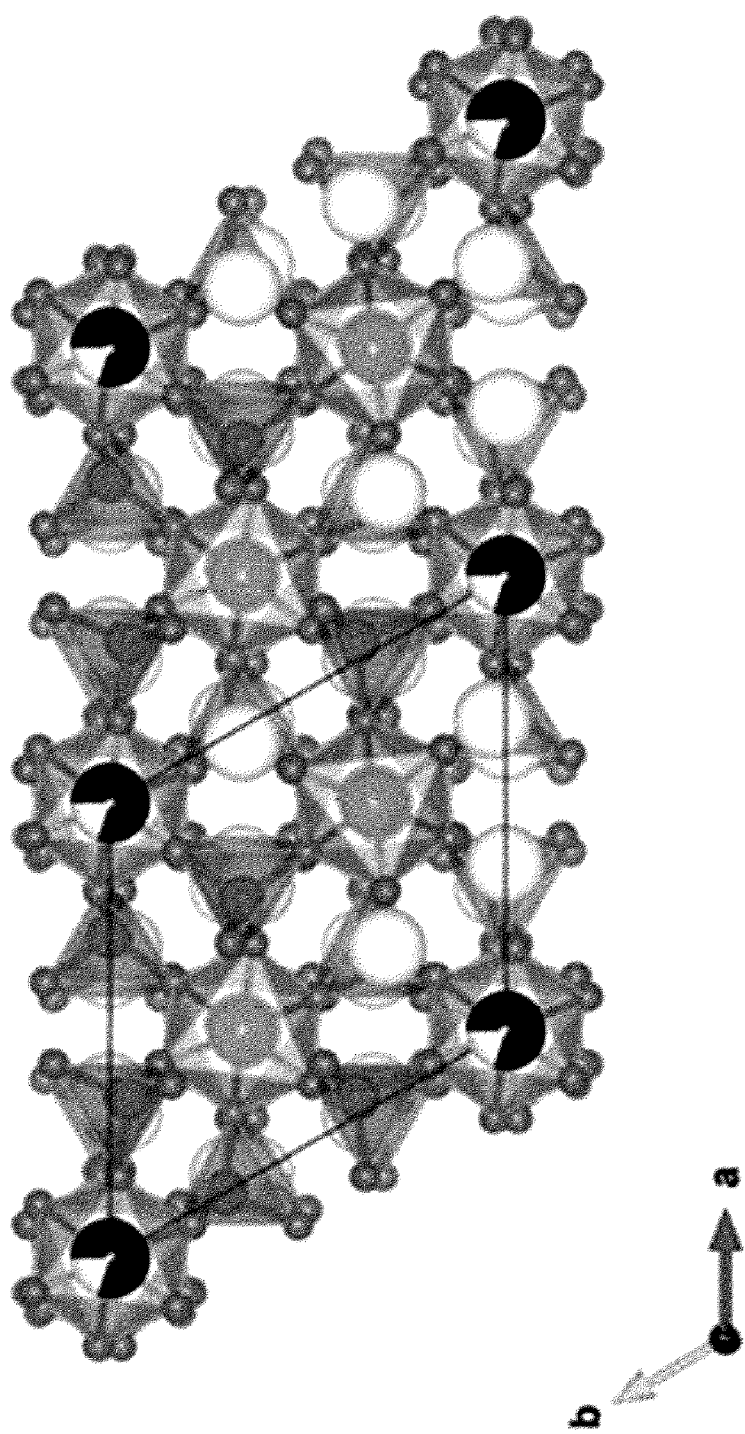
FIG. 4 shows a crystal structure model of $\gamma$-$Na_3Sc_2P_3O_{12}$ to the phosphor of the X-ray diffraction pattern of FIG. 2.

The powder X-ray diffraction measurement of the prepared standard material powder and the $Na_{0.88}Sc_2P_3O_{12}$:$Ce^{3+}_{0.04}$ phosphor obtained in Example 2 was performed using the Kα line of Cu. The resulting chart is shown in FIG. 3. Both compounds showed the patterns of FIG. 3, and were judged to be a γ-$Na_3Sc_2P_3O_{12}$ crystal phase based on the index of Table 2. The spatial group, determined according to a conventional document report [M. de la Rochère et al., Solid State Ionics 9-10 (1983) 825-828], was R-3c (spatial group #167).

Experimental Example 3

As for the phosphor obtained in Example 1, the PL results (the relative emission intensity and the main wavelength of emission) depending on the content of substituted Eu were analyzed. The results are shown in FIG. 5.

Figure 5:
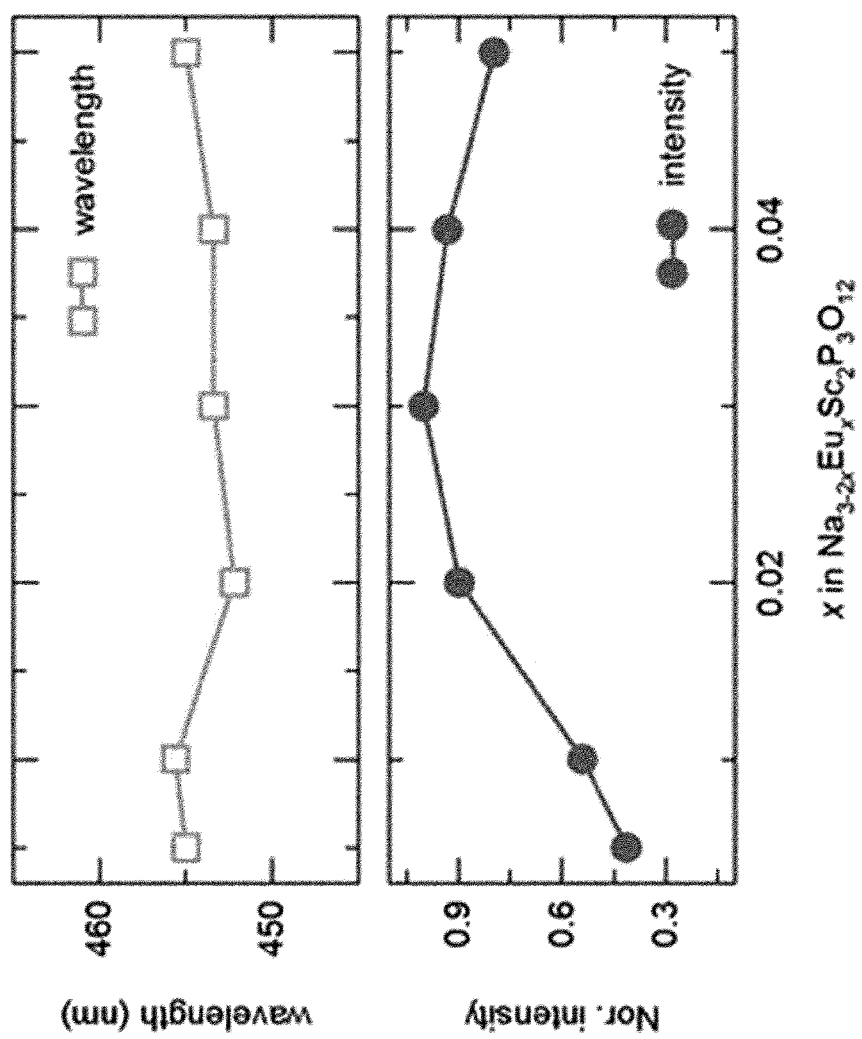
FIG. 5 is a graph showing a change in maximum wavelength and intensity of emission depending on substituted europium in the phosphor (Example 1) according to the Example of the present invention.

From FIG. 5, it can be seen that the relative emission intensity of the phosphor of Example 1 depends on the content of substituted Eu. The emission intensity is increased as the amount of Eu, which is an activator, is increased. However, when the molar composition ratio is more than 0.03 mol, the drop in intensity due to the concentration quenching effect is increased. From the experimental results, it can be seen that the molar composition ratio of Eu contained in the phosphor is preferably 0.03 to 0.04 mol. Further, it can be seen that the best emission intensity is obtained when the molar composition ratio of Eu is 0.04 mol.

Experimental Example 4

Figure 6:
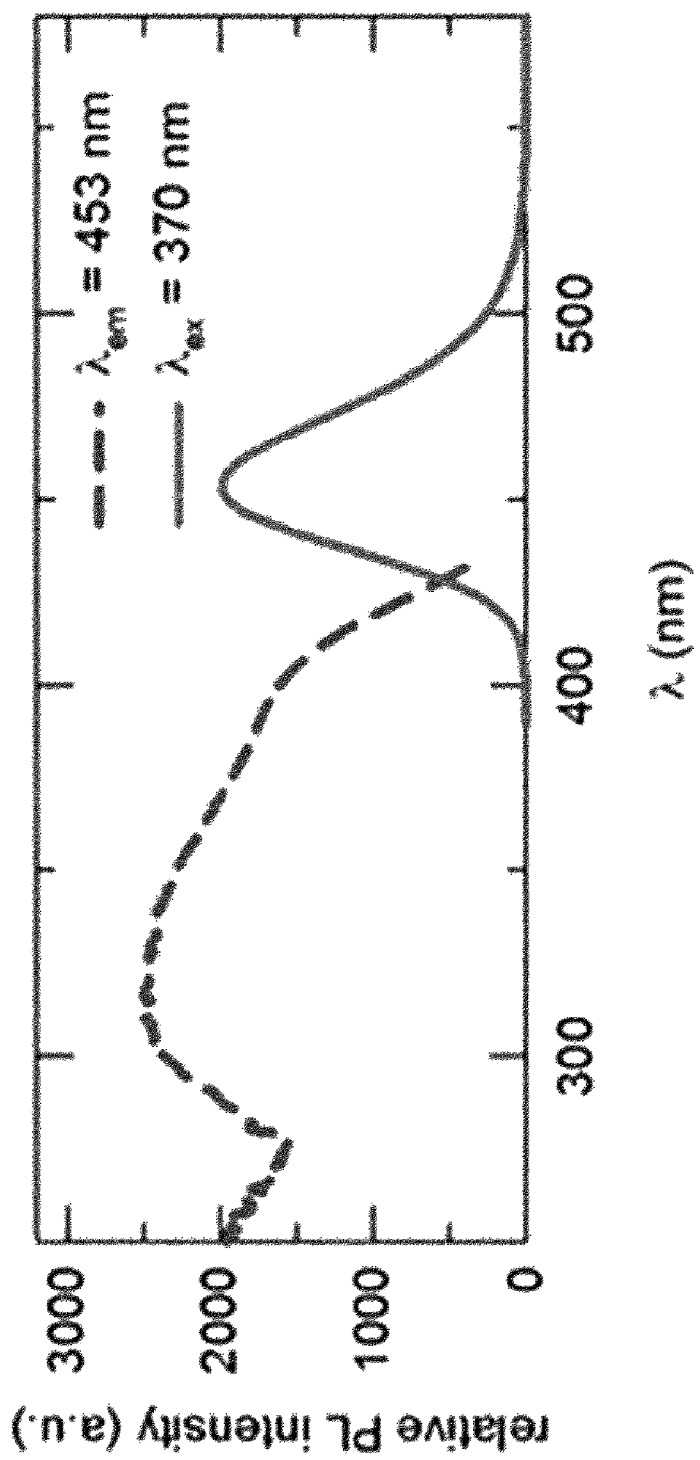
FIG. 6 shows excitation and emission spectra of the phosphor (Example 1) according to the Example of the present invention.

As for the fluorescent substance obtained in Example 1, excitation and light emission spectra were observed, and the results are shown in FIG. 6.

From FIG. 6, it can be seen that the phosphor obtained in Example 1 emits blue light having a wavelength of 400 to 500 nm when an excitation source of ultraviolet rays, visible rays, or electron rays having a wavelength of 100 to 440 nm is radiated thereon.

Experimental Example 5

As for the phosphor obtained in Example 2, the PL results (the relative emission intensity and the main wavelength of emission) depending on the content of substituted Ce were analyzed. The results are shown in FIG. 7.

Figure 7:
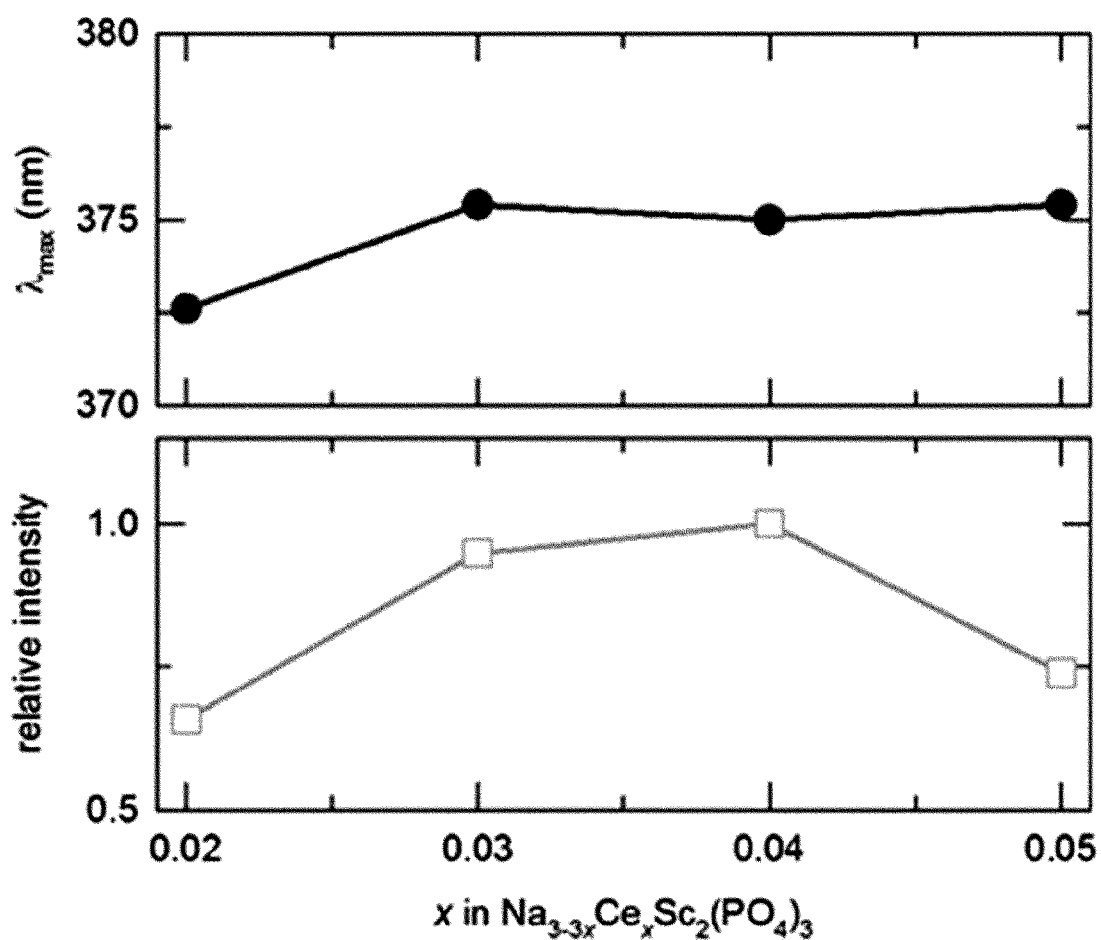
FIG. 7 is a graph showing a change in maximum wavelength and intensity of emission depending on substituted cerium in the phosphor (Example 2) according to another Example of the present invention.

From FIG. 7, it can be seen that the relative emission intensity of the phosphor of Example 2 depends on the content of substituted Ce. The emission intensity is increased as the amount of Ce, which is an activator, is increased. However, when the molar composition ratio is more than 0.04 mol, the intensity drop due to the concentration quenching effect is increased. From the experimental results, it can be seen that the molar composition ratio of Ce contained in the phosphor is preferably 0.03 to 0.04 mol. Further, it can be seen that the best emission intensity is obtained when the molar composition ratio of Ce is 0.04 mol.

Experimental Example 6

Figure 8:
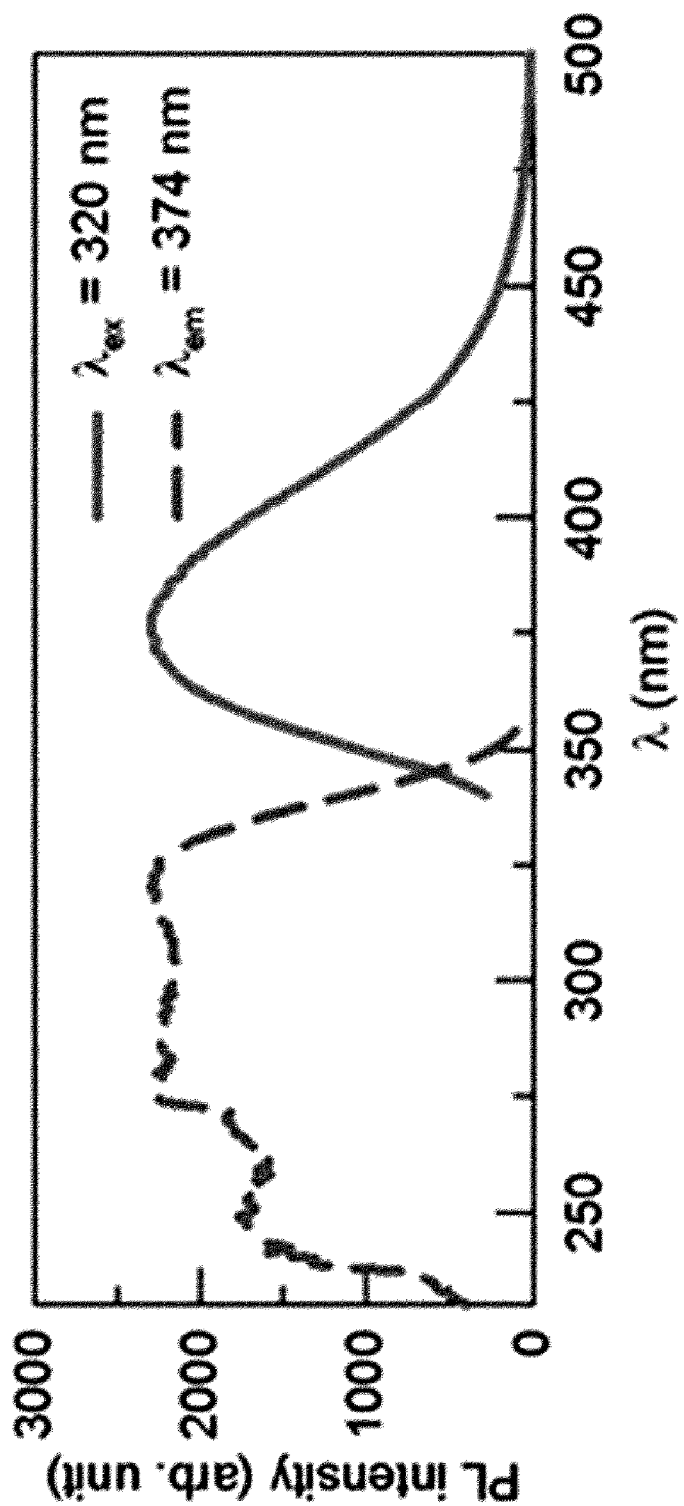
FIG. 8 shows excitation and emission spectra of the phosphor (Example 2) according to another Example of the present invention.

As for the phosphor obtained in Example 2, excitation and emission spectra were observed, and the results are shown in FIG. 8.

From FIG. 8, it can be seen that the phosphor obtained in Example 2 emits near-ultraviolet rays having a wavelength of 350 to 450 nm when an excitation source of ultraviolet rays, visible rays, or electron rays having a wavelength of 100 to 360 nm is radiated thereon.

Experimental Example 7

The change in crystal phase depending on the temperature of the phosphor obtained in Example 1 was observed using X-ray diffraction measurement, and an experiment was performed in order to observe the change in emission intensity depending on the change in crystal phase. The X-ray diffraction pattern and the emission intensity variation graph obtained from the experimental results are shown in FIGS. 9 and 10, respectively.

Figure 9:
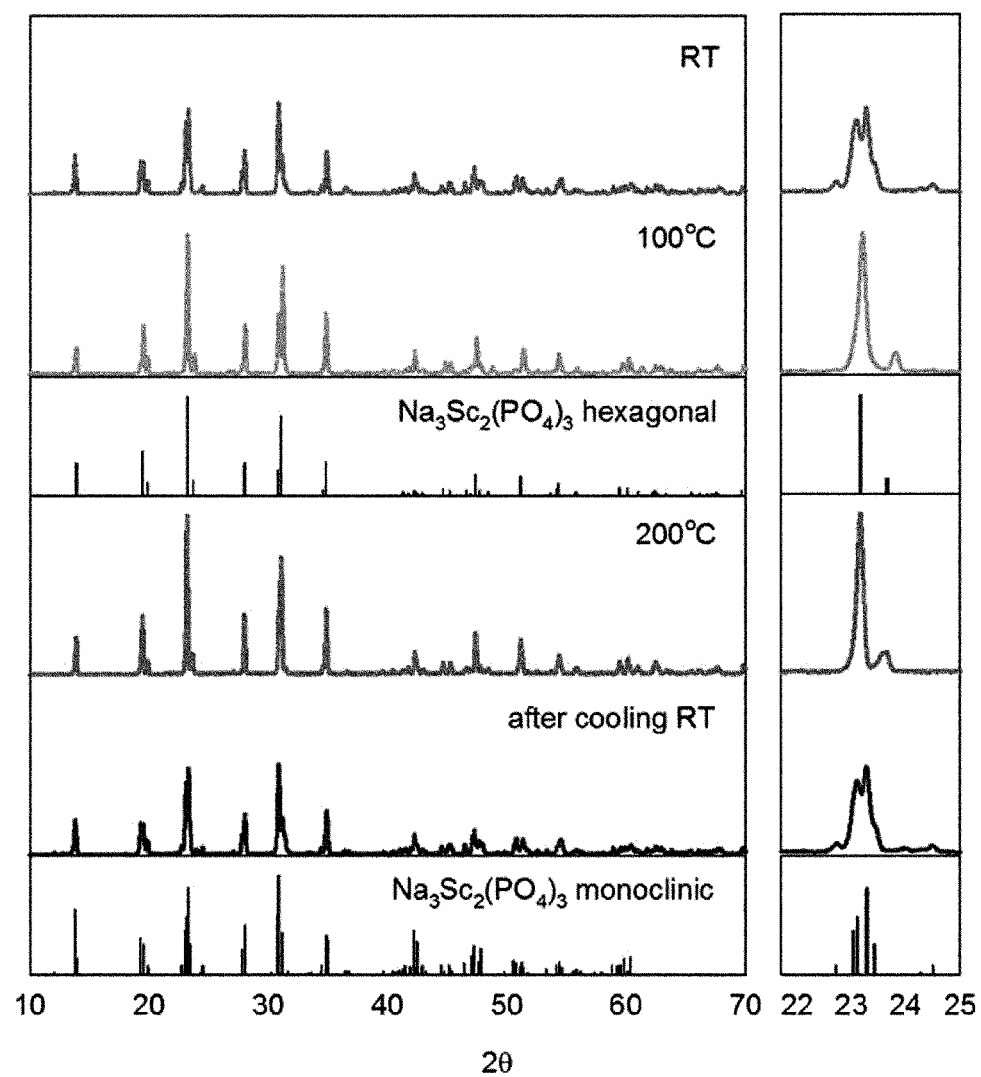
FIG. 9 shows X-ray diffraction patterns depending on the temperature of the phosphor (Example 1) according to the Example of the present invention.

From FIG. 9, it can be seen that an α-$Na_3Sc_2P_3O_{12}$ structure is changed into a γ-$Na_3Sc_2P_3O_{12}$ structure when the temperature is increased and that the γ-$Na_3Sc_2P_3O_{12}$ structure is changed into the α-$Na_3Sc_2P_3O_{12}$ structure when the temperature is reduced to room temperature. In addition, from FIG. 10, it can be seen that the emission intensity is maintained and then increased as the temperature is increased. From the above results, it can be seen that the crystal phase is changed depending on the temperature to thus improve photoluminescence. This is one of the most important characteristics of the phosphor of the present invention.

Experimental Example 8

Figure 10:
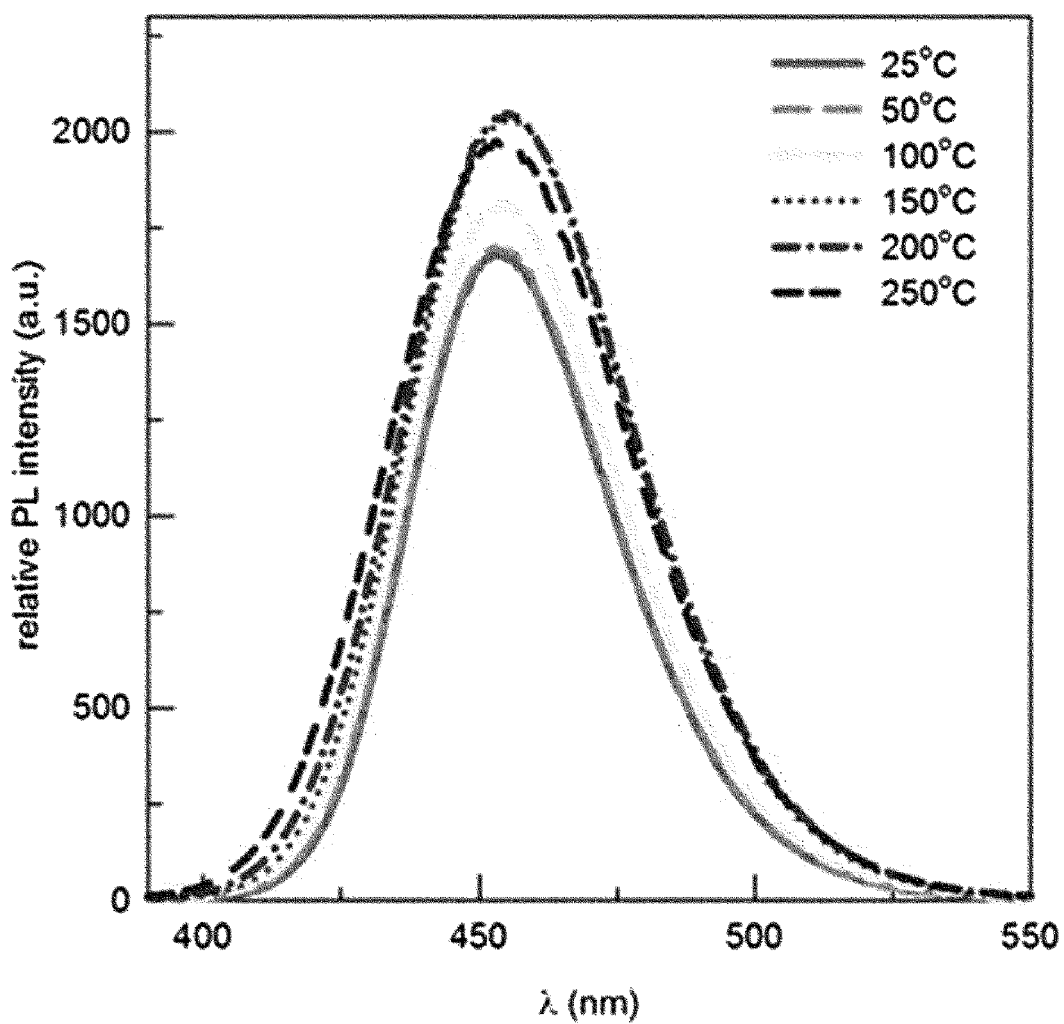
FIG. 10 shows the emission spectrum depending on the temperature of the phosphor (Example 1) according to the Example of the present invention.

The change in emission intensity depending on the temperature of the phosphor obtained in Example 2 is shown in FIG. 10.

Figure 11:
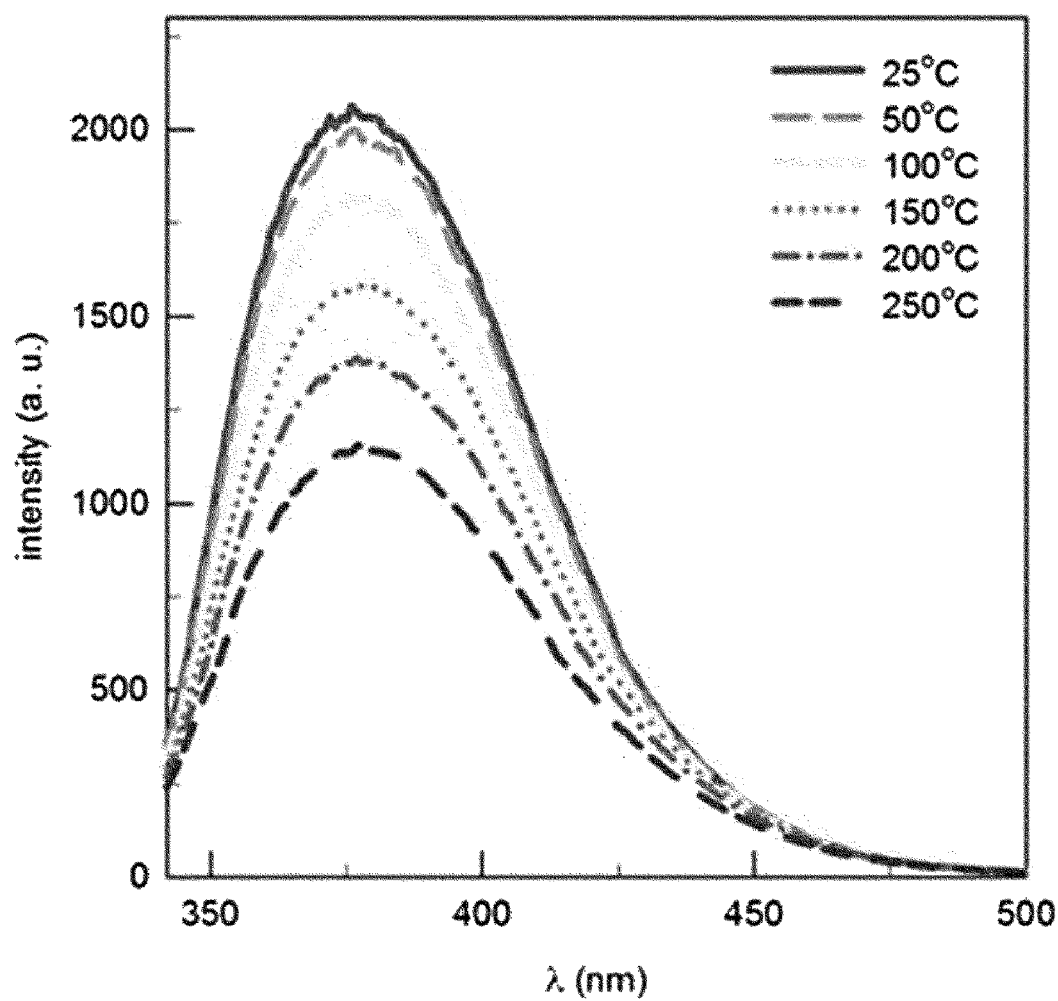
FIG. 11 shows the emission spectrum depending on the temperature of the phosphor (Example 2) according to another Example of the present invention.

From FIG. 11, it can be seen that the emission intensity of the phosphor having a γ-$Na_3Sc_2P_3O_{12}$ structure at room temperature is reduced as the temperature is increased due to the thermal quenching effect. Therefore, it can be seen that, in the structure having a characteristic exhibiting a change in phase when the temperature is changed from room temperature to a high temperature, photoluminescence at high temperatures is improved due to this characteristic.

Example 3

The blue phosphor obtained in Example 1 and commercial green and red phosphor were mixed with a silicon resin. The mixture was inserted into a surface-mount device (SMD)-type LED and cured at 150° C. for 1 hour, thereby manufacturing a WLED based on an LED having an excitation wavelength of 365 nm.

Experimental Example 9

Figure 12:
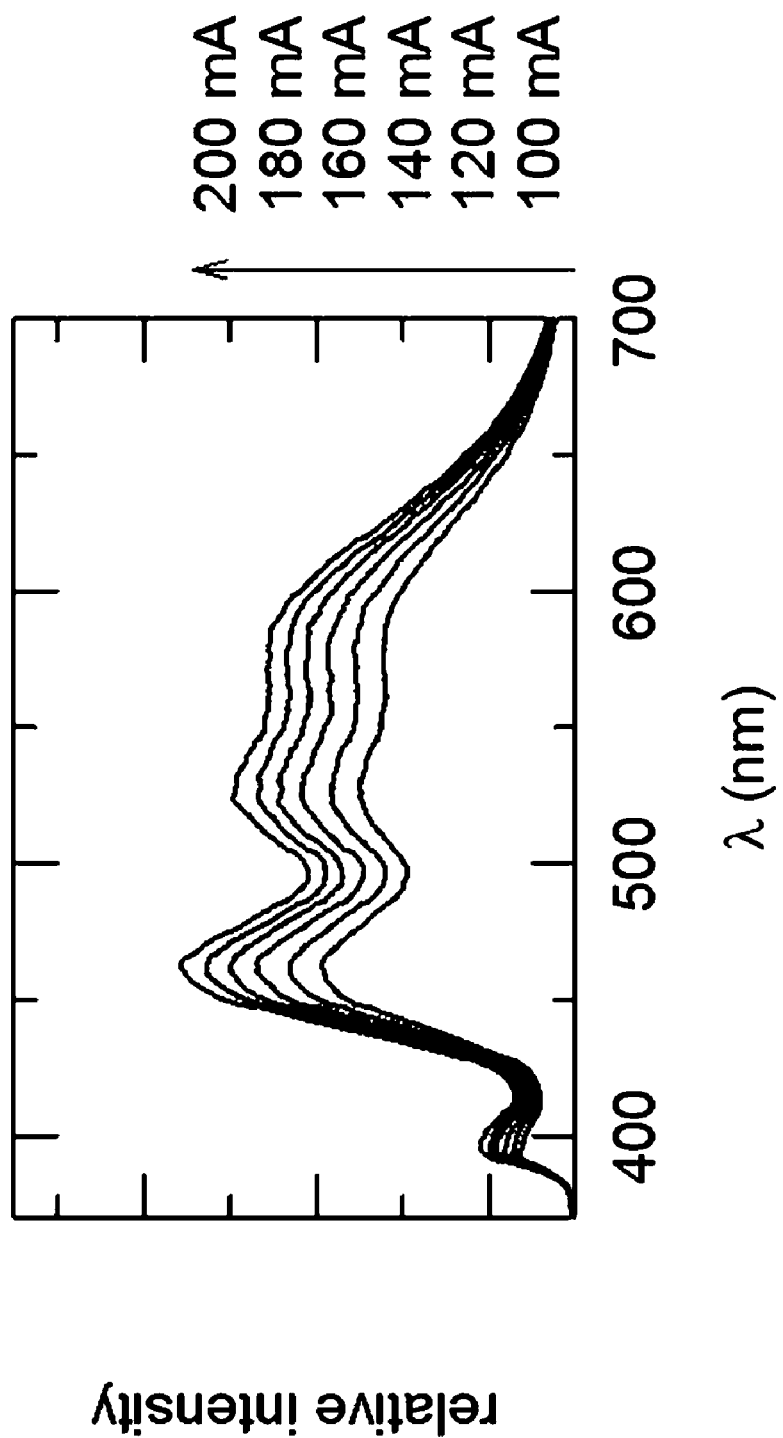
FIG. 12 shows the spectrum of an LED lighting apparatus (Example 3) according to still another Example of the present invention.

The change in emission spectrum depending on the current mA applied to the WLED manufactured in Example 3 was measured, and the result is shown in FIG. 12.

From FIG. 12, it can be seen that the phosphor obtained in Example 1 of the present invention exhibits excellent light characteristics when excited at a wavelength of about 365 nm.

Experimental Example 10

Figure 13:
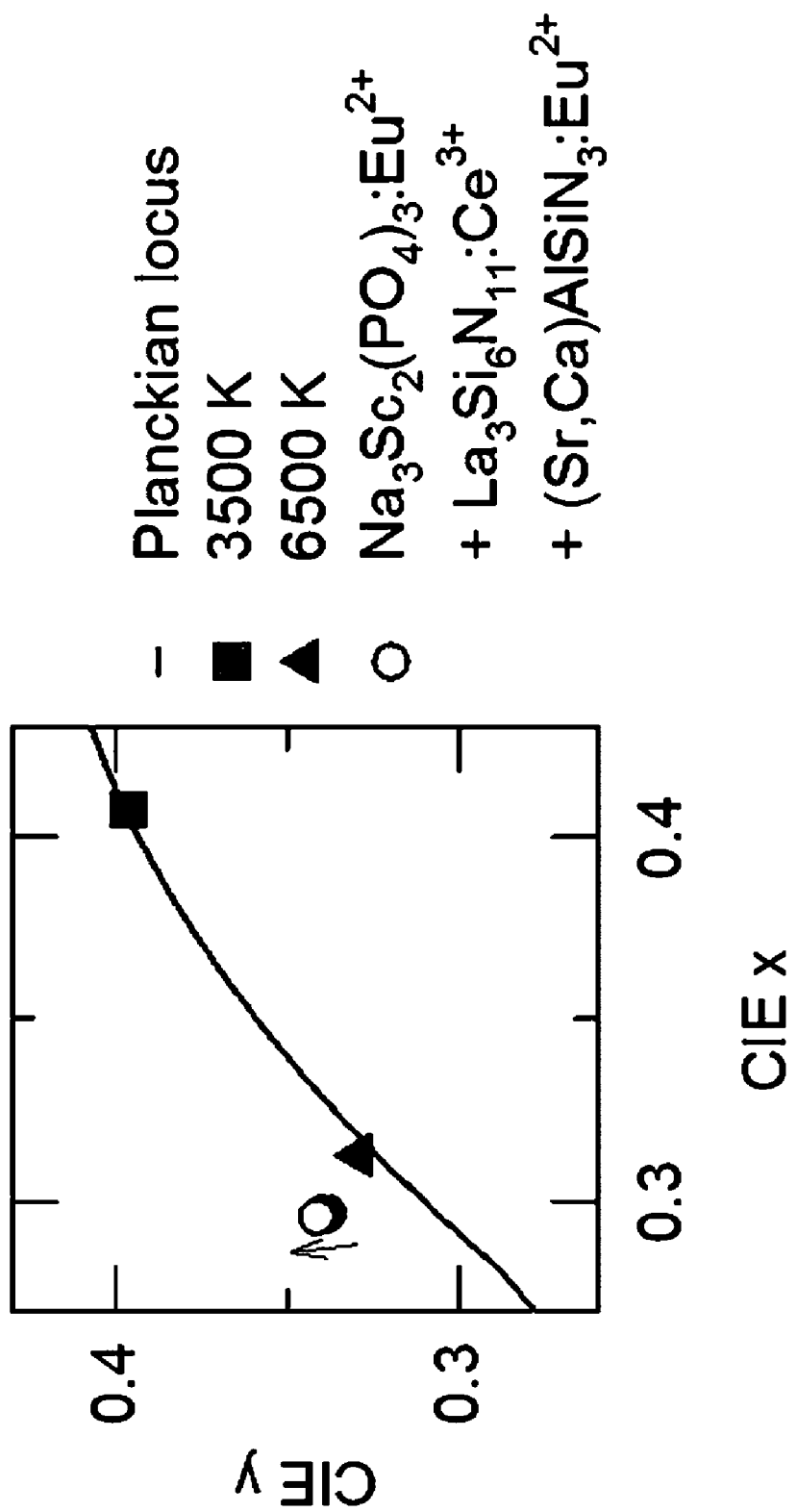
FIG. 13 shows the CIE coordinates of the LED lighting apparatus (Example 3) according to still another Example of the present invention.

A change in CIE coordinates depending on the current mA applied to the WLED manufactured in Example 3 was measured, and the results are shown in FIG. 13. The (x, y) values of the CIE color coordinates when the current of 100 mA was applied were obtained. The color temperature of the color rendering index (CRI) of 97 was 7253 K. Since the values (0.33, 0.33) correspond to an ideal white color in the CIE color coordinates and a commercial LED lamp has a CRI of about 85, the above results show that there is a possibility of application of the present invention to the WLED, although optimization needs to be performed using additional experiments.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A phosphor having the following Chemical Formula 1:

$$A_{1+x}B_xC_{2-x}D_3X_{12}:AE_y \quad \text{[Chemical Formula 1]}$$

where A is one type or two types of elements selected from a group consisting of monovalent metal cations;

B is one type or two types of elements selected from a group consisting of trivalent cations;

C is one type or two types of elements selected from a group consisting of tetravalent cations;

D is one type or two types of elements selected from a group consisting of pentavalent cations;

X is one type or two types of elements selected from a group consisting of N, O, F, P, S, O, Cl, and Br;

AE is one type or two types of elements selected from a group consisting of Mn, Ce, Nd, Sm, Eu, Tb, Dy, Ho, Er, Tm, Yb, Th, U, and Bi;

$0 \leq x \leq 2$; and $0 \leq y \leq 0.1$, wherein the phosphor has a characteristic exhibiting a phase transition depending on a temperature.

2. The phosphor of claim 1, wherein A is any one among Li, Na, K, Rb, and Cs, B is any one among Sc, Cr, Fe, Y, La, Gd, and Lu, C is any one among C, Si, Ti, Ge, and Zr, and D is any one among N, P, and V.

3. A phosphor having the following Chemical Formula 2-1 or 2-2:

$$Na_{3-2x}Sc_2P_3O_{12}:Eu^{2+}_x \quad \text{[Chemical Formula 2-1]}$$

$$Na_{3-3x}Sc_2P_3O_{12}:Ce^{3+}_x \quad \text{[Chemical Formula 2-2]}$$

where $0 < x \leq 0.5$, wherein the phosphor has a characteristic exhibiting a phase transition depending on a temperature and is imparted with an improved emission intensity by heating.

4. A phosphor composition, comprising:
the phosphor according to claim 1, and
a crystal phase or non-crystal phase compound different from the phosphor.

5. The phosphor composition of claim 4, wherein the phosphor is a powder having an average particle size in a range of 0.1 to 20 μm.

6. The phosphor composition of claim 4, wherein the crystal phase or non-crystal phase compound is a conductive inorganic material, and is an oxide, an oxynitride, or a nitride including one type element or two types or more elements selected from among Zn, Al, Ga, In, and Sn.

7. The phosphor composition of claim 4, wherein the crystal phase or non-crystal phase compound is an inorganic luminescent material having a fluorescence which is different from a fluorescence of the phosphor.

8. A light-emitting device comprising:
an excitation light source of 300 to 550 nm; and
at least one of (i) the phosphor according to claim 1 and (ii) a phosphor composition comprising the phosphor and a crystal phase or non-crystal phase compound different from the phosphor.

9. An image display unit comprising:
at least one of (i) the phosphor according to claim 1 and (ii) a phosphor composition comprising the phosphor and a crystal phase or non-crystal phase compound different from the phosphor.

10. A pigment comprising:
at least one of (i) the phosphor according to claim 1 and (ii) a phosphor composition comprising the phosphor and a crystal phase or non-crystal phase compound different from the phosphor.

11. An ultraviolet-ray absorbent comprising:
at least one of (i) the phosphor according to claim 1 and (ii) a phosphor composition comprising the phosphor and a crystal phase or non-crystal phase compound different from the phosphor.

12. A phosphor composition comprising:
the phosphor according to claim 2 and
a crystal phase or non-crystal phase compound different from the phosphor.

13. A phosphor composition comprising:
the phosphor according to claim 3 and
a crystal phase or non-crystal phase compound different from the phosphor.

14. A light-emitting device comprising:
an excitation light source of 300 to 550 nm; and
at least one of (i) the phosphor according to claim 2 and (ii) a phosphor composition comprising the phosphor and a crystal phase or non-crystal phase compound different from the phosphor.

15. A light-emitting device comprising:
an excitation light source of 300 to 550 nm; and
at least one of (i) the phosphor according to claim 3 and (ii) a phosphor composition comprising the phosphor and a crystal phase or non-crystal phase compound different from the phosphor.

16. An image display unit comprising:
at least one of (i) the phosphor according to claim 2 and (ii) a phosphor composition comprising the phosphor and a crystal phase or non-crystal phase compound different from the phosphor.

17. A pigment comprising:
at least one of (i) the phosphor according to claim 2 and (ii) a phosphor composition comprising the phosphor and a crystal phase or non-crystal phase compound different from the phosphor.

18. An ultraviolet-ray absorbent comprising:
at least one of (i) the phosphor according to claim 2 and (ii) a phosphor composition comprising the phosphor and a crystal phase or non-crystal phase compound different from the phosphor.

19. The phosphor of claim 1, wherein B is selected from the group consisting of Cr, Fe, Y, La, Gd, and Lu.

20. The phosphor of claim 1, wherein the phosphor has C of Formula 1, and C is selected from the group consisting of C, Si, Ti, Ge, and Zr.

21. The phosphor of claim 3, comprising $Na_{2.88}Sc_2P_3O_{12}$:$Ce^{3+}_{0.04}$ or $Na_{2.92}Sc_2P_3O_{12}$:$Eu^{2+}_{0.04}$.

22. The phosphor of claim 1, wherein AE is one type or two types of elements selected from a group consisting of Mn, Ce, Nd, Sm, Dy, Ho, Er, Tm, Yb, Th, U, and Bi.

23. The phosphor of claim 1, wherein the phosphor is changed in crystal structure and is imparted with an improved emission intensity by heating.

24. The phosphor of claim 23, wherein the phosphor has the same crystal structure as an $\alpha$-$Na_3Sc_2P_3O_{12}$ crystal phase or a solid solution of the $\alpha$-$Na_3Sc_2P_3O_{12}$ crystal phase at room temperature, has the same crystal structure as a $\beta$-$Na_3Sc_2P_3O_{12}$ crystal phase or a solid solution of the $\beta$-$Na_3Sc_2P_3O_{12}$ crystal phase when the phosphor is heated to 50 to 60° C., and has the same crystal structure as a $\gamma$-$Na_3Sc_2P_3O_{12}$ crystal phase or a solid solution of the $\gamma$-$Na_3Sc_2P_3O_{12}$ crystal phase when the phosphor is heated to 150° C. or higher.

* * * * *